(12) United States Patent     (10) Patent No.:     US 8,713,809 B2
Ohmori et al.                 (45) Date of Patent:     May 6, 2014

(54) FLUXGATE SENSOR AND ELECTRONIC COMPASS MAKING USE THEREOF

(75) Inventors: Kenichi Ohmori, Sakura (JP); Takuya Aizawa, Sakura (JP); Osamu Nakao, Sakura (JP)

(73) Assignee: Fujikura Ltd., Tokyo (JP)

( * ) Notice: Subject to any disclaimer, the term of this patent is extended or adjusted under 35 U.S.C. 154(b) by 43 days.

(21) Appl. No.: 13/300,036

(22) Filed: Nov. 18, 2011

(65) Prior Publication Data

US 2012/0151786 A1    Jun. 21, 2012

Related U.S. Application Data

(63) Continuation of application No. PCT/JP2010/003428, filed on May 21, 2010.

(30) Foreign Application Priority Data

May 21, 2009   (JP) ................................. 2009-123110

(51) Int. Cl.
   *G01R 33/05*    (2006.01)
   *G01R 33/02*    (2006.01)
   *G01C 17/30*    (2006.01)

(52) U.S. Cl.
   USPC ............................................................ 33/361

(58) Field of Classification Search
   USPC ....................................... 33/361, 340, 355 R
   See application file for complete search history.

(56) References Cited

U.S. PATENT DOCUMENTS

| | | | | |
|---|---|---|---|---|
| 4,267,640 | A | * | 5/1981 | Wu .................................. 33/361 |
| 5,764,055 | A | * | 6/1998 | Kawase ......................... 324/249 |
| 5,850,624 | A | | 12/1998 | Gard et al. |
| 6,536,123 | B2 | | 3/2003 | Tamura |
| 2002/0153886 | A1 | | 10/2002 | Kawakami |
| 2003/0173961 | A1 | | 9/2003 | Choi et al. |
| 2007/0222441 | A1 | | 9/2007 | Satoh |

FOREIGN PATENT DOCUMENTS

| | | |
|---|---|---|
| CN | 2781394 Y | 5/2006 |
| CN | 20094115 Y | 8/2007 |
| CN | 101427394 A | 5/2009 |
| FR | 2 802 650 A1 | 6/2001 |

(Continued)

OTHER PUBLICATIONS

Lassahn, Martin, et al., "A Multi-Channel Magnetometer for Field Structure Measurement Based on Time Encoded Flux-Gate Sensors," IEEE Transactions on Instrumentation and Measurement, Apr. 1993, pp. 635-639, vol. 42, No. 2.
Pavel, Ripka, "Magnetic Sensors and Magnetometers," Artech House, Inc, 2001, p. 94.
Office Action issued by Korean Patent Office in Korean Patent Application No. 10-2011-7026808 dated Apr. 16, 2013.
Office Action issued by Taiwan Patent Office in Taiwanese Patent Application No. 099115942 dated Apr. 19, 2013.
Office Action issued by Chinese Patent Office in Chinese Patent Application No. 201080021371.8 dated Jul. 23, 2013.

*Primary Examiner* — Christopher Fulton
(74) *Attorney, Agent, or Firm* — Sughrue Mion, PLLC

(57) ABSTRACT

Provided is a flux gate sensor comprising the following: a magnetic core having a first wiring layer formed on a board, a first insulating layer formed in such a way as to cover the aforementioned first wiring layer, and a magnetic core which is formed on the aforementioned first insulating layer and which has a central portion and an end portion that continues to the aforementioned central portion, that has a width larger than the width of the aforementioned central portion, and that is located on either side of the aforementioned central portion; a second insulating layer which covers the aforementioned magnetic core and which is formed on the aforementioned first insulating layer; and a second wiring layer formed on the aforementioned second insulating layer.

12 Claims, 15 Drawing Sheets

(56) References Cited

FOREIGN PATENT DOCUMENTS

| | | |
|---|---|---|
| JP | 08-179023 A | 7/1996 |
| JP | 2004-184098 A | 7/2004 |
| JP | 2006-234615 A | 9/2006 |
| JP | 2007-279029 A | 10/2007 |
| KR | 10-2008-0107418 A | 12/2008 |
| WO | WO 2007/126164 A1 | 11/2007 |

* cited by examiner

FLUXGATE SENSOR AND ELECTRONIC COMPASS MAKING USE THEREOF

CROSS REFERENCE TO RELATED APPLICATIONS

This application is a continuation application based on a PCT Patent Application No. PCT/JP2010/003428, filed May 21, 2010, whose priority is claimed on Japanese Patent Application No. 2009-123110, filed May 21, 2009, the entire content of which are hereby incorporated by reference.

BACKGROUND OF THE INVENTION

1. Field of the Invention

The present invention relates to a miniature fluxgate sensor that is manufactured via a thin-film process, and to an electronic compass in which this fluxgate sensor is used. In particular, the present invention relates to a fluxgate sensor that not only is small in size and is highly sensitive, but also has a high level of excitation efficiency and a high degree of design freedom, and to an electronic compass in which this fluxgate sensor is used.

2. Description of the Related Art

Conventional magnetic sensors include those that utilize the Hall effect, those that utilize a magnetoresistive (MR) effect, and those that utilize a giant magnetoresistive (GMR) effect. Because these are manufactured via a thin-film process, they can be miniaturized and integrated, and are therefore widely used in portable devices and the like.

However, the sensitivity of these sensors is lowered when they are miniaturized, and it becomes difficult for geomagnetic levels of approximately 0.3 Oe, such as are detected by an electronic compass, to be detected accurately, and the azimuth accuracy in electronic compasses that use these sensors is limited to approximately 10 degrees.

Moreover, in recent years, electronic compasses that are based on magneto-impedance sensors (referred to below as MI sensors) that use amorphous wire, and orthogonal fluxgate sensors have been proposed, and highly accurate compasses that provide an azimuth accuracy of approximately 2.5 degrees have been achieved. In addition, electronic compasses that use miniature fluxgate sensors that are manufactured via a thin-film process have also been proposed (see, for example, Japanese Unexamined Patent Applications, First Publications Nos. 2007-279029, 2006-234615 and 2004-184098, and PCT International Publication No. WO 2007-126164 Pamphlet).

In order to increase azimuth accuracy, in particular, the detection resolution and linearity errors that are determined by the sensor sensitivity are important elements. In MI sensors, orthogonal fluxgate sensors, and fluxgate sensors, the resolution is regarded as being approximately the same. Moreover, a large number of components such as speakers, vibration motors, and magnets and the like that serve as magnetic field generation sources are mounted inside the devices, and the sensors are affected by the magnetic fields generated from these components. In order for a sensor to operate correctly in the presence of a magnetic field generated from a peripherally placed component, it is desirable for the measurement magnetic field range to be sufficiently broad.

If linearity errors are considered, then in the case of MI sensors and orthogonal fluxgate sensors, hysteresis is also output in the output voltage due to hysteresis in the magnetic core. Because of this, linearity errors are made worse. In order to improve linearity, a method that utilizes a negative feedback circuit may be used, however, this causes power consumption to increase and also makes the circuit more complex.

In contrast, in the case of a fluxgate sensor, by using the phase-delay method described in Pavel Ripka, "Magnetic Sensors and Magnetometers", p. 94, ARTECH HOUSE, INC (2001), a magnetic sensor that is not affected by magnetic core hysteresis and has superior linearity can be achieved. If this method is used, the sensor output is made based on a time domain, and not only is it possible to remove the effects of hysteresis which is caused by the coercive force of the magnetic core that makes up the sensor, but it is also possible for digital detection using a counter to be made. As a consequence, it is possible to remove the effects of errors which occur during A/D conversion, and it is possible to construct a sensor having superior linearity.

According to IEEE TRANSACTIONS ON INSTRUMENTATION AND MEASUREMENT, VOL. 42, NO. 2, p. 635, APRIL 1993, by using the aforementioned method, a linearity of 0.06% FS can be achieved. In an MI sensor that uses amorphous wire, linearity errors are 1-2%. Consequently, by using a fluxgate sensor having superior linearity in this way, it is possible to achieve an electronic compass having greater azimuth accuracy.

As is described above, by using a fluxgate sensor that employs a phase-delay method which has a high resolution and superior linearity, it is possible to construct an electronic compass having excellent azimuth accuracy. However, it is necessary in a fluxgate sensor for an excitation coil and detection coil to be wound around the periphery of the magnetic core. Accordingly, compared with an MI sensor or an orthogonal fluxgate sensor that are constructed with only a bias coil or a pickup coil being wound around the core, it is difficult to achieve a miniaturization of the size of a fluxgate sensor.

In order to achieve further miniaturization and integration, attempts are being made to manufacture a fluxgate sensor using a thin-film process. However, the diamagnetic field effect is increased by the miniaturization so that there is a decrease in sensitivity. In particular, if this type of sensor is used to try and make an electronic compass which has sensitivity in three axial directions, then it is necessary to set a magnetic sensitivity direction in a perpendicular direction relative to the substrate forming part of the electronic compass, so that, as a result, it is necessary to package the sensors in a vertically upright state on the substrate used to form the electronic compass. As a consequence, when the aim is to make a thinner electronic compass, then it is necessary for the length of the sensor which extends vertically upright from the substrate to be shortened in the direction of the magnetic sensitivity thereof. For example, if the thickness of the electronic compass needs to be kept to 1 mm or less, then considering the thickness of the substrate and the molding resin, it is necessary to keep the length of the sensor in the direction of magnetic sensitivity to approximately 0.5 to 0.7 mm. However, if the length of the magnetic core is no more than 1 mm, the effect of the diamagnetic field is increased and there is a marked decrease in sensitivity.

In order to solve the above described problems, Japanese Unexamined Patent Application, First Publication No. 2007-279029 and PCT International Publication No. WO 2007-126164 Pamphlet disclose an H-type of magnetic core in which the width of the end portions of the magnetic core has been widened. In this structure, the excitation coil and the detection coil are only wound around the narrow portion of the magnetic core center portion. Accordingly, if the size of the sensor is reduced, the number of coils that can be wound around the excitation coil and magnetic coil is restricted, and it becomes difficult to secure a sufficient number of coils. Because the structure is one in which the excitation coil and the magnetic coil are wound alternatingly, the number of coils ends up being determined by the sensor size and the coil pitch. Accordingly, it becomes difficult to set the number of coils of both the detection coil and the pickup coil independently of each other, so that the degree of design freedom is constricted.

FIG. 15 is a schematic view showing the shape of a magnetic core of a conventional fluxgate sensor. The magnetic core has end portions 1 and a center portion 2. In Japanese Unexamined Patent Application, First Publication No. 2007-279029, it is disclosed that a ratio B/A of the width B of the end portions 1 shown in FIG. 15 relative to the length A of the magnetic core in the longitudinal direction is preferably 0.8 to 1.2. It is also disclosed that a ratio C/B of the width C of the center portion 2 shown in FIG. 15 relative to the width B of the end portions 1 is preferably 0.033 to 0.2. When the value of the ratio B/D of the width B of the end portions 1 shown in FIG. 15 relative to the length D of the end portions 1 in the longitudinal direction exceeds 1, then the length of the magnetic core in an orthogonal direction relative to the magnetic sensitivity direction of the sensor becomes longer. Accordingly, the shape magnetic anisotropy in the end portions 1 has an easy axis in the transverse direction of the sensor. As a consequence, the flux density of the end portions 1 tends to become more sensitive to the magnetic field in an orthogonal direction relative to the magnetic sensitivity direction of the sensor. As a result, if an electronic compass is created by arranging a plurality of the above described fluxgate sensors perpendicularly to each other, the magnetic cores of the fluxgate sensors are easily affected by the magnetic field in an orthogonal direction relative to the detection magnetic field, and the cross-axis sensitivity of the electronic compass increases. Moreover, because a distortion is generated in the pickup waveform by the magnetic field in an orthogonal direction relative to the detection magnetic field, output abnormalities are easily generated and the orthogonality of each axis deteriorates. Here, the term cross-axis sensitivity refers to changes in the output of the magnetic field in the X-axial direction in a sensor whose magnetic sensitivity direction is the Y-axial direction or the Z-axial direction when, for example, the magnetic field in the X-axial direction is being detected. If the cross-axis sensitivity increases, the orthogonality of the axes deteriorates, and the azimuth accuracy of the electronic compass also deteriorates. In addition, not only are pulse-shaped temporal changes in the pickup voltage included in the cross-axis sensitivity, but changes in output that are caused by changes in the pulse waveform itself are also included therein.

SUMMARY

The present invention provides a fluxgate sensor that, in addition to having a small size and a high level of sensitivity, has a high level of excitation efficiency, and a high degree of design freedom, and also provides an electronic compass in which this fluxgate sensor is used.

The fluxgate sensor of the present invention includes: a first wiring layer that is formed on a substrate; a first insulating layer that is formed so as to cover the first wiring layer; a magnetic core that is formed on the first insulating layer, and that includes a center portion, and first and second end portions that are continuous with the center portion and have a broader width than the width of the center portion, and are positioned at the two ends of the center portion; a second insulating layer that covers the magnetic core, and is formed on the first insulating layer; and a second wiring layer that is formed on the second insulating layer, and it is also possible for the first wiring layer and the second wiring layer to have a plurality of wires that are substantially parallel to each other, and for the two ends of the wires of the first wiring layer and of the wires of the second wiring layer to be electrically connected together via portions where the first insulating layer and the second insulating layer have been selectively removed, and for spiral-shaped first solenoid coils to be wound around the first and second end portions, and for a spiral-shaped second solenoid coil to be wound around the center portion.

It is also possible for the first solenoid coil to contain a third solenoid that is wound around the first end portion and a fourth solenoid coil that is wound around the second end portion, and for the third solenoid coil and the fourth solenoid coil to be connected together in series, and have substantially the same number of winds. It is desirable for the third solenoid coil and the fourth solenoid coil to have the same number of winds, however, due to factors such as the way in which the electrode pads are wound, cases in which the number of winds are not absolutely identical are also acceptable.

It is also possible for the first solenoid coil to be wound around the center portion and the first and second end portions.

It is also possible for a value of a ratio B/D between a width B of the first and second end portions and a length D of the longitudinal direction of the first and second end portions to be less than 1.

The electronic compass of the present invention includes: a substrate; and first, second, and third fluxgate sensors that are located on the substrate, and that are aligned respectively with three axes, and each of the first, second, and third fluxgate sensors includes: a first wiring layer that is formed on a substrate; a first insulating layer that is formed so as to cover the first wiring layer; a magnetic core that is formed on the first insulating layer, and that includes a center portion, and first and second end portions that are continuous with the center portion and have a broader width than the width of the center portion, and are positioned at the two ends of the center portion; a second insulating layer that covers the magnetic core, and is formed on the first insulating layer; and a second wiring layer that is formed on the second insulating layer, and it is also possible for the first wiring layer and the second wiring layer to have a plurality of wires that are substantially parallel to each other, and for the two ends of the wires of the first wiring layer and of the wires of the second wiring layer to be electrically connected together via portions where the first insulating layer and the second insulating layer have been selectively removed, and for spiral-shaped first solenoid coils to be wound around the first and second end portions, and for a spiral-shaped second solenoid coil to be wound around the center portion.

It is also possible for the first solenoid coil to contain a third solenoid that is wound around the first end portion and a fourth solenoid coil that is wound around the second end portion, and for the third solenoid coil and the fourth solenoid coil to be connected together in series, and have substantially the same number of winds.

It is also possible for the first solenoid coil to be wound around the center portion and the first and second end portions.

It is also possible for a value of a ratio B/D between a width B of the first and second end portions and a length D of the longitudinal direction of the first and second end portions to be less than 1.

The fluxgate sensor of the present invention includes at least: a first wiring layer; a first insulating layer that is formed so as to cover the first wiring layer; a magnetic core that is formed on the first insulating layer, and that is provided with a detection portion, and first and second excitation portions that are continuous with the detection portion and have a broader width than the width of the detection portion, and are positioned at the two ends of the detection portion; a second insulating layer that covers the magnetic core, and is formed on the first insulating layer; and a second wiring layer that is formed on the second insulating layer, and it is also possible for the first wiring layer and the second wiring layer to have a plurality of wires that are substantially parallel to each other, and for the two ends of the wires of the first wiring layer and of the wires of the second wiring layer to be electrically connected together via portions where the first insulating layer and the second insulating layer have been selectively removed, and for spiral-shaped excitation coils to be wound around the first and second excitation portions.

It is also possible for the excitation coils to contain a first excitation coil that is wound around the first excitation portion, and a second excitation coil that is wound around the second excitation portion, and for the first excitation coil and the second excitation coil to be connected together in series such that the magnetic fields they generate are aligned in the same direction.

It is also possible for the excitation coils to be wound around the excitation portions and the detection portion that is formed in the center portion of the magnetic core.

It is also possible for an electronic compass of the present invention to be formed such that three fluxgate sensors are located on a single substrate, so that they are aligned respectively with three axes.

According to the present invention, by winding excitation coils around the wide end portions of a magnetic core, the number of coils wound on the excitation coil is increased, and magnetic flux generated from the excitation coils in the end portions can be applied in concentration in the center portion.

According to the present invention, because it is possible to supply current simultaneously to two excitation coils, the electrode pads can be decreased, and a reduction in size can be achieved.

According to the present invention, by winding an excitation coil in a center portion as well, even stronger excitation can be performed.

According to the present invention, by using a highly accurate fluxgate sensor, the high level of azimuth accuracy can be achieved.

DESCRIPTION OF THE PREFERRED EMBODIMENTS

The present invention will be now described herein with reference to illustrative embodiments. Those skilled in the art will recognize that many alternative embodiments can be accomplished using the teaching of the present invention and that the present invention is not limited to the embodiments illustrated for explanatory purpose.

First Preferred Embodiment

Hereinafter, a first preferred embodiment of the present invention will be described in detail with reference made to the drawings.

Figure 1A:
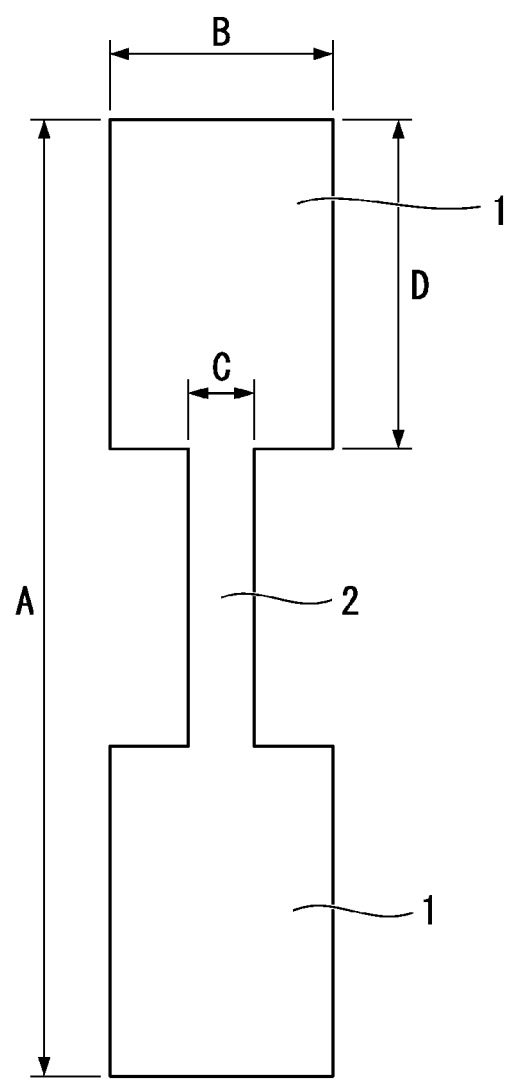
FIG. 1A is a plan view showing an example in which the shape of end portions of a magnetic core of a fluxgate sensor according to a first preferred embodiment of the present invention is rectangular.
Figure 1B:
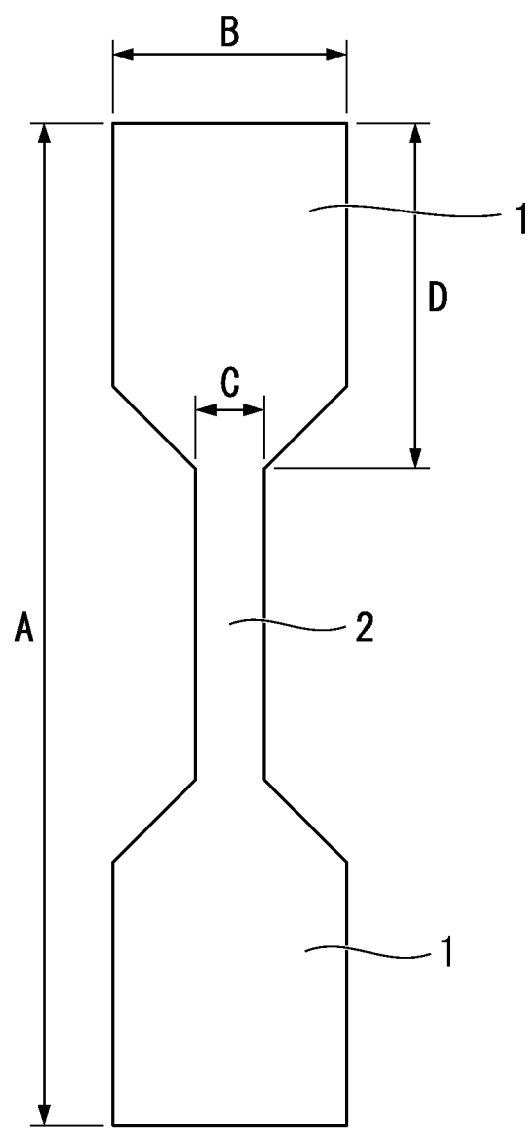
FIG. 1B is a plan view showing an example in which boundary portions between end portions 1 and a center portion 2 of the magnetic core of the fluxgate sensor according to the first preferred embodiment of the present invention are tapered.

FIG. 1A and FIG. 1B are plan views showing examples of the shape of a magnetic core of a fluxgate sensor according to a first preferred embodiment of the present invention. As is shown in FIG. 1A and FIG. 1B, the magnetic core of the fluxgate sensor of the first preferred embodiment of the present invention has end portions 1 and a center portion 2. A width B of the end portions 1 is greater than a width C of the center portion 2. A length A in the longitudinal direction of the magnetic core is not more than 1 mm, and desirably not more than 0.5 mm. The value of a ratio B/D between the width B of the end portions 1 and a length D in the longitudinal direction of the end portions 1 is less than 1. The longitudinal direction of the magnetic core of the fluxgate sensor coincides with the direction of magnetic sensitivity of the fluxgate sensor. Although not shown in FIGS. 1A and 1B, excitation coils are wound around the circumferences of the end portions 1, and a pickup coil is wound around the circumference of the center portion 2. FIG. 1A is a plan view showing an example in which the shape of the end portions of the magnetic core is rectangular. FIG. 1B is a plan view showing an example in which boundary portions between the end portions 1 and the center portion 2 of the magnetic core have a tapered shape. As is shown in FIG. 1B, in order to suppress localized saturation of the magnetic flux in corner portions, it is desirable for the boundary portions between the end portions 1 and the center portion 2 to be a substantially tapered shape. In this case, if the length D in the longitudinal direction of the end portions 1 represents a length which includes the substantially tapered portion, then it is desirable for the value of the ratio B/D between the width B of the end portions 1 and the length D in the longitudinal direction of the end portions 1 to be less than 1.

In a magnetic thin-film the ratio between the film-thickness direction and the in-plane direction is sizable at between several hundreds and several thousands. Accordingly, there is a difference in the demagnetization field coefficients of between several hundreds and several thousands between the film-thickness direction and the in-plane direction, so that the demagnetization field coefficient in the in-plane direction is extremely small. If the magnetic thin-film is patterned so as to provide it with a longitudinal direction, then the demagnetization field coefficient is decided by the dimensional ratio between the longitudinal direction and the transverse direction. In this case, there is a small demagnetization field coefficient in the longitudinal direction, and a large demagnetization field coefficient in the transverse direction. Consequently, the shape anisotropy is such that the easy axis is in the longitudinal direction.

As is described above, the fluxgate sensor of the first preferred embodiment of the present invention has the end portions 1 which are wider than the center portion 2 in the magnetic core thereof, and the width B of the end portions 1 is smaller than the length D in the longitudinal direction of the end portions 1. The easy axis according to the shape anisotropy of the end portions 1 is the longitudinal direction of the fluxgate sensor. Accordingly, there is little change in the flux density within the core that is caused by the magnetic field which is orthogonal to the direction of magnetic sensitivity, so that the sensitivity characteristics of the other axes are excellent. As a consequence, it is possible to create an electronic compass that has superior azimuth accuracy.

Operating principles of the fluxgate sensor according to the first preferred embodiment of the present invention will now be described.

Figure 2:
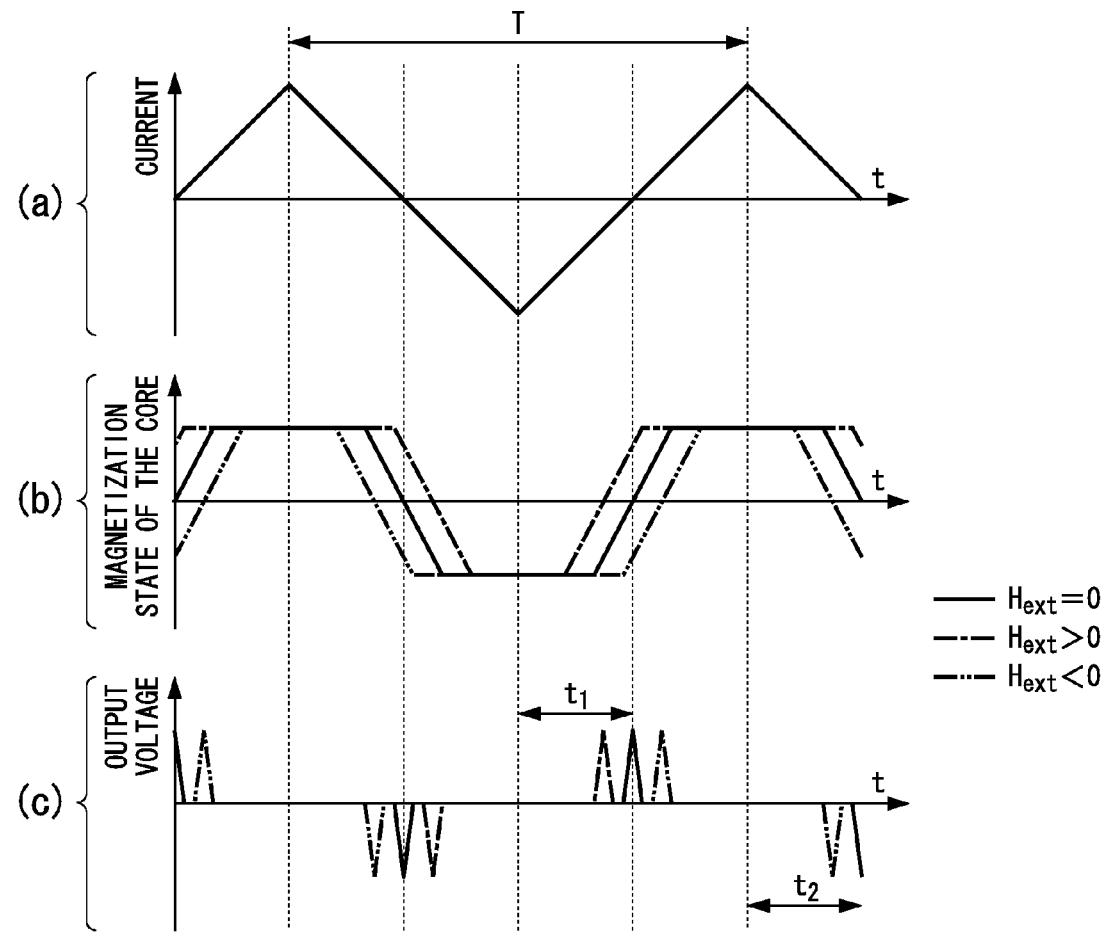
FIG. 2 contains graphs (a)-(c) showing an operating principle of the fluxgate sensor according to the first preferred embodiment of the present invention.
Figure 3:
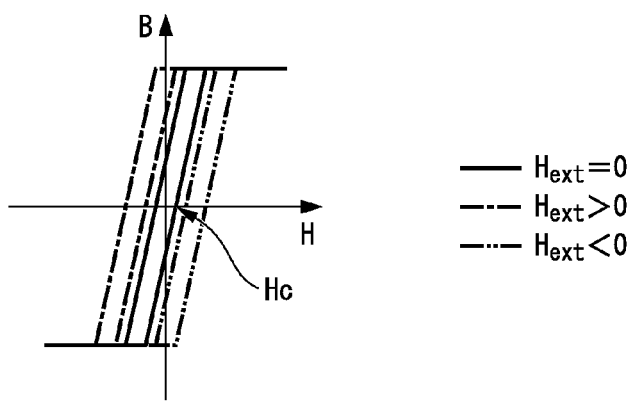
FIG. 3 is a hysteresis loop showing changes over time in the magnetization state of the magnetic core of the fluxgate sensor according to the first preferred embodiment of the present invention.

FIG. 2 contains graphs that show the operating principles of the fluxgate sensor according to the first preferred embodiment of the present invention. FIG. 2(a) is a graph that shows changes over time in a triangular wave current which is supplied to an excitation coil. FIG. 2(b) is a graph that shows changes over time in the magnetization state of a core. FIG. 2(c) is a graph that shows changes over time in the output voltage generated in a pickup coil. FIG. 3 is a hysteresis loop showing changes over time in the magnetization state of the magnetic core of the fluxgate sensor according to the first preferred embodiment of the present invention. When a triangular wave current such as that shown in FIG. 2(a) is supplied to the excitation coil, the magnetic core is excited by a magnetic field Hexc created by the excitation coil, and because the flux density B within the magnetic core, namely, the magnetization state of the magnetic core has saturation characteristics, it changes over time in the manner shown in FIG. 2(b). In areas in the pickup coil where a time derivative of the flux density B of the magnetic core, namely, where the temporal change dB/dt is present, an output voltage Vpu=NS×dB/dt which is proportional to the cross-sectional area S of the magnetic core and the number of winds N in the pickup coil is generated. The output voltage Vpu of the pickup coil changes over time in the manner shown in FIG. 2(c). The greater the size of the temporal change dB/dt of the flux density B of the magnetic core, the higher the high value of the pickup voltage wave and the narrower the pulse width, so that a steeper pulse voltage is obtained. A time interval t1 shown in FIG. 2(c) is expressed by the following Formula (1) using an external magnetic field Hext, a shift Hc in the strength H of the magnetic field between when flux density B of the magnetic core increases and when it decreases, the magnetic field Hexc created by the excitation coil, a period T of the triangular wave, and a delay time Td created by the inductance of the coil.

$$t_1 = \left(\frac{H_{exc} + H_c - H_{ext}}{H_{exc}}\right)\frac{T}{4} + T_d \quad (1)$$

In the same way, a time interval t2 shown in FIG. 2(c) is expressed by the following Formula (2).

$$t_2 = \left(\frac{H_{exc} + H_c - H_{ext}}{H_{exc}}\right)\frac{T}{4} + T_d \quad (2)$$

An amount of change t2−t1 in the time interval relative to the external magnetic field obtained from Formula (1) and Formula (2) is expressed by the following Formula (3).

$$t_2 - t_1 = \frac{H_{ext}}{H_{exc}}\frac{T}{2} \quad (3)$$

From Formula (3) it can be seen that the amount of change t2−t1 in the time interval relative to the external magnetic field depends on the ratio Hext/Hexc between the external magnetic field Hext and the magnetic field Hexc created by the excitation coil, and on the period T of the triangular wave. The sensitivity S=d (t2−t1)/d Hext relative to the external magnetic field is expressed by S=T/(2·Iexc×α) using the amplitude Iexc of the current supplied to the excitation coil, the generated magnetic field per unit of current flowing in the excitation coil, namely, the excitation efficiency α, and the period T of the triangular wave. Accordingly, the greater the excitation current, the smaller the sensitivity S of the sensor. The greater the period T of the triangular wave, namely, the smaller the excitation frequency fexc, the greater the sensitivity S of the sensor.

The excitation efficiency α is a value which is determined by the number of winds of the coil and the magnetic core which make up the fluxgate sensor. The greater the excitation efficiency α, the smaller the current required to drive the fluxgate sensor. Moreover, in Formula (3), Formula (3) is 0 when Hext=Hexc, and at this time, Hext forms the upper limit of the measured magnetic field range. Because Hexc is expressed as =α×Iexc, the greater the excitation efficiency α, the broader the measured magnetic field range becomes if the fluxgate sensor is driven by the same current.

Figure 4:
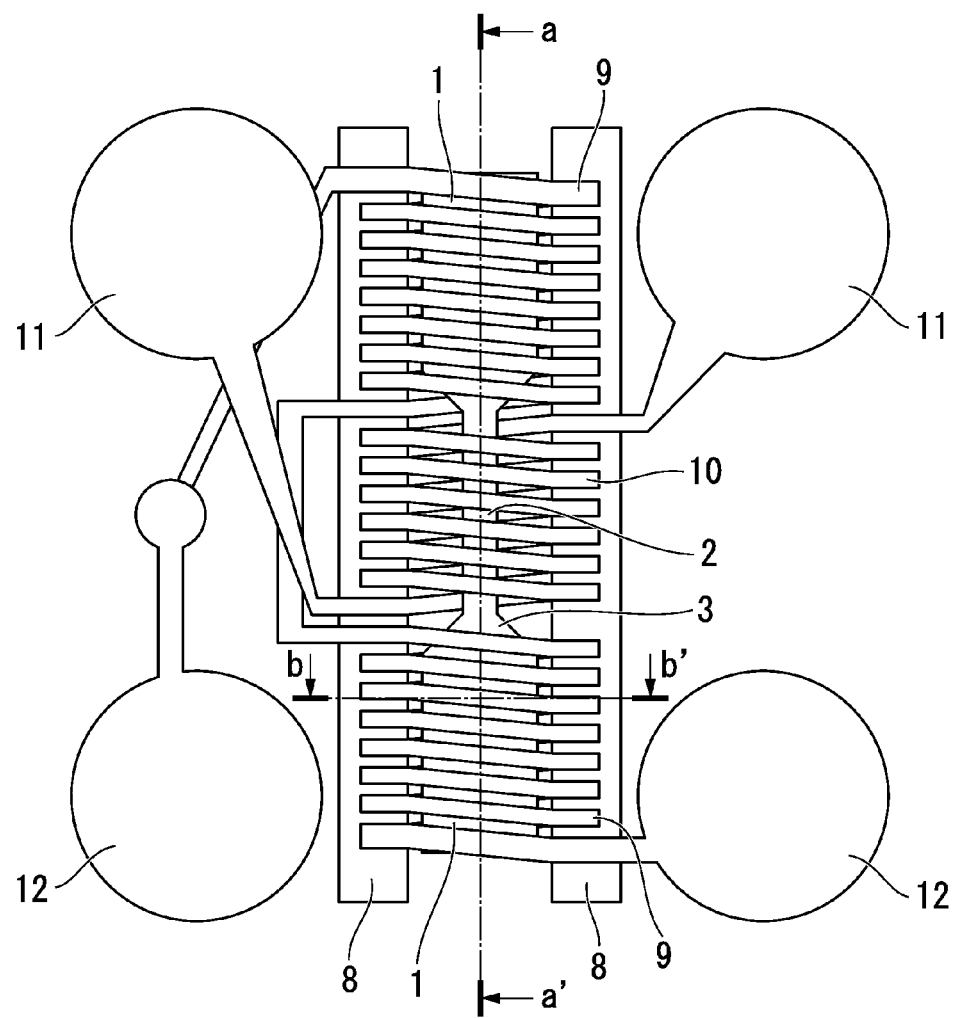
FIG. 4 is a top view schematically showing the fluxgate sensor according to the first preferred embodiment of the present invention.
Figure 5:
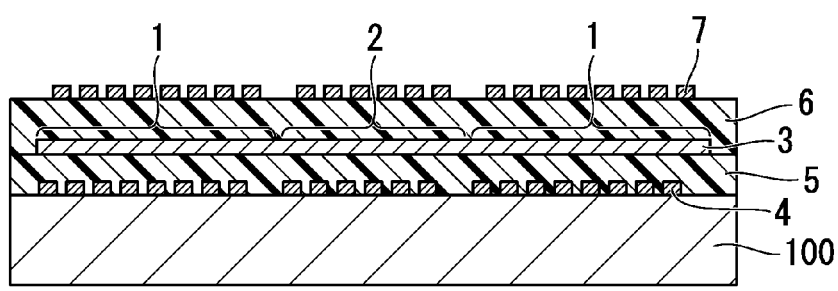
FIG. 5 is a cross-sectional view taken along a line a-a' shown in FIG. 4.

FIG. 4 is a top view schematically showing the fluxgate sensor according to the first preferred embodiment of the present invention. FIG. 5 is a cross-sectional view taken along a line a-a' shown in FIG. 4. FIGS. 6A through 6E are cross-sectional views taken along a line b-b' shown in FIG. 4, and show fluxgate sensor manufacturing steps.

As is shown in FIG. 4 and FIG. 5, the fluxgate sensor of the first preferred embodiment of the present invention includes a magnetic core 3, a first wiring layer 4, a first insulating layer 5, a second insulating layer 6, a second wiring layer 7, an aperture portion 8, and a substrate 100. The magnetic core 3 includes end portions 1 and a center portion 2. The first wiring layer 4 and the second wiring layer 7 form first solenoid coils 9 which are wound around the end portions 1, and a second solenoid coil 10 which is wound around the center portion 2.

In the first preferred embodiment of the present invention, the first solenoid coils 9 which are wound around the end portions 1 form excitation coils. The second solenoid coil 10 which is wound around the center portion 2 forms a pickup coil. In the first preferred embodiment of the present invention the end portions 1 form excitation portions, and the center portion 2 forms a detection portion.

Figure 6A:
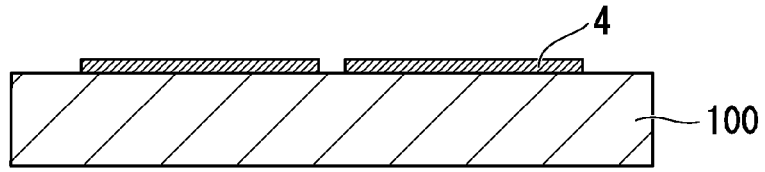
FIG. 6A is a cross-sectional view taken along a line b-b' shown in FIG. 4, and shows a fluxgate sensor manufacturing step.
Figure 6B:
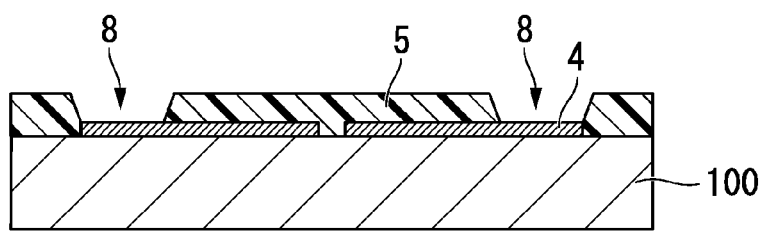
FIG. 6B is a cross-sectional view taken along a line b-b' shown in FIG. 4, and shows a fluxgate sensor manufacturing step.

A process to manufacture the fluxgate sensor of the first preferred embodiment of the present invention will now be described using FIGS. 6A through 6E. Firstly, as is shown in FIG. 6A, the first wiring layer 4 which is used to form the bottom-side wiring of the solenoid coils is formed on the non-magnetic substrate 100. Next, as is shown in FIG. 6B, the first insulating layer 5 which is used to insulate the magnetic core 3 and the solenoid coil is formed on the first wiring layer 4. Here, the aperture portions 8 are formed in those portions of the first insulating layer 5 where the first wiring layer 4 and the second wiring layer 7, which forms the top-side wiring of the solenoid coil which is formed subsequently, are connected together.

Figure 6C:
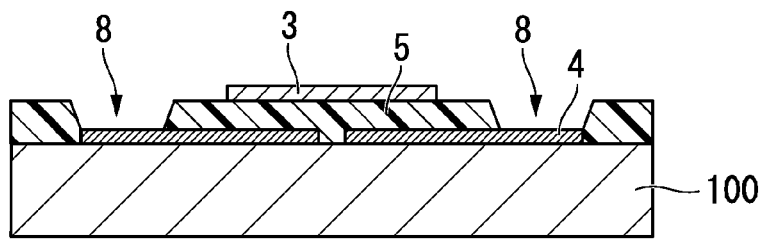
FIG. 6C is a cross-sectional view taken along a line b-b' shown in FIG. 4, and shows a fluxgate sensor manufacturing step.

Next, as is shown in FIG. 6C, the magnetic core 3 which is formed by a soft magnetic body film is formed on the first insulating layer 5. As is shown in FIG. 4, the shape of this magnetic core 3 which is formed from a soft magnetic body film is such that the width of the center portion 2 is narrower than the width of the end portions 1.

Figure 6D:
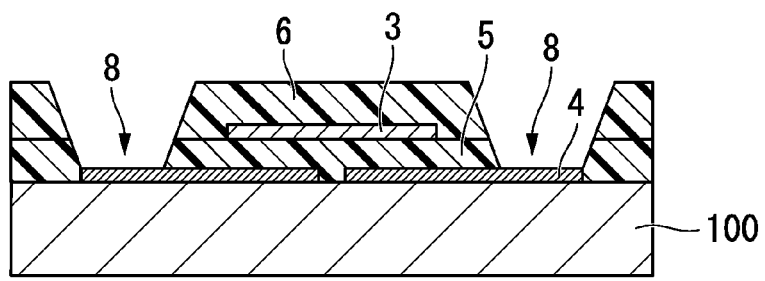
FIG. 6D is a cross-sectional view taken along a line b-b' shown in FIG. 4, and shows a fluxgate sensor manufacturing step.
Figure 6E:
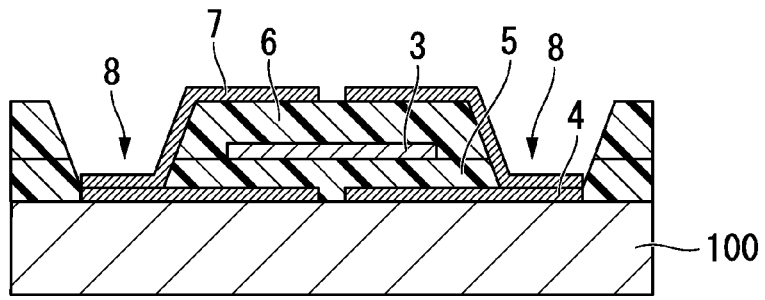
FIG. 6E is a cross-sectional view taken along a line b-b' shown in FIG. 4, and shows a fluxgate sensor manufacturing step.

Next, as is shown in FIG. 6D, the second insulating layer 6 in which the aperture portions 8 are provided in connecting portions between the first wiring layer 4 and the second wiring layer 7 is formed on top of the magnetic core 3. Furthermore, as is shown in FIG. 6E, the second wiring layer 7 is formed on top of the second insulating layer 6 such that the end portions of the wires thereof are connected to the end portions of the wires of the first wiring layer 4 which are adjacent thereto, so as to thereby form a solenoid coil.

Because the wires are connected to the wires which are adjacent thereto, the loop of the solenoid coil as seen in cross-section is not closed.

The first solenoid coils 9 and the second solenoid coil 10 which are formed by the first wiring layer 4 and the second wiring layer 7 are wound independently of each other in the wide end portions 1 at both ends of the magnetic core 3, and in the narrow center portion 2 thereof. The first solenoid coils 9 which are around the wide end portions 1 at the two ends of the magnetic core 3 include a third solenoid coil which is wound around the end portion 1 at one end thereof, and a fourth solenoid coil which is wound around the end portion 1 at the other end thereof. The third solenoid coil and the fourth solenoid coil at the two end portions are connected together in series by the first wiring layer 4 or the second wiring layer 7 such that the directions of the magnetic fields they generate are the same, and such that together they form the first solenoid coils 9. Electrode pads 11 which are used for external connections are formed at both ends of the second solenoid coil 10 which is wound around the center portion 2 of the magnetic core 3. Electrode pads 12 which are used for external connections are formed at both ends of the two first solenoid coils 9 which are wound around the end portions 1 at both ends of the magnetic core 3 and are connected together in series.

It is preferable for the third solenoid coil and the fourth solenoid coil that are wound respectively around the two end portions of the magnetic core 3 to have the same number of winds and to be mutually symmetrical.

Note that a portion of the bottom-side wiring of the magnetic core 3 in which the first solenoid coil 9 and the second solenoid coil 10 are shown in typical form has been omitted from FIG. 4. Moreover, the shape of the first solenoid coil 9 and the second solenoid coil 10 is not limited to the shape shown in FIG. 4.

FIG. 5 is an example of a cross-sectional view taken along a line a-a' shown in FIG. 4 of the fluxgate sensor according to the first preferred embodiment of the present invention, and the positional relationship between the first wiring layer 4 and the second wiring layer 7 in the fluxgate sensor according to the first preferred embodiment of the present invention is not limited to the configuration shown in FIG. 5.

FIGS. 6A through 6E are examples of a cross-sectional view taken along a line b-b' shown in FIG. 4 of the fluxgate sensor according to the first preferred embodiment of the present invention, and the shape of the fluxgate sensor according to the first preferred embodiment of the present invention is not limited to the shape shown in FIGS. 6A through 6E.

The wide end portions 1 at both ends of the magnetic core 3 are excited as a result of power being supplied to the first solenoid coils 9 which are wound around the circumferences thereof. In contrast, induced voltage is applied to the narrow center portion 2 of the magnetic core 3, and this induced voltage is detected by the second solenoid coil 10 which is wound around the circumference of the center portion 2.

Alternating current which changes over time is supplied from the outside via the electrode pads 12 to the first solenoid coils (i.e., the excitation coils) 9 at the end portions 1 of the magnetic core 3, resulting in the magnetic core 3 undergoing alternating excitation. The magnetic flux generated in the end portions 1 is guided to the center portion 2 of the magnetic core 3. As a result of this, the center portion 2 of the magnetic core 3 also undergoes alternating excitation, and a substantially pulse-shaped induced voltage is generated in the second solenoid coil (i.e., the detection coil) 10 of the center portion 2. This induced voltage can be detected by the second solenoid coil 10 and by an external detection circuit via the electrode pads 11. Here, it is desirable for the alternating current which is supplied to the first solenoid coil 9 to be a fixed frequency triangular wave.

At this time, if an external magnetic field is applied, the timings at which the aforementioned substantially pulse-shaped induced voltage is generated show changes over time. A positive induced voltage is output at the timings when the triangular wave current switches from positive to negative. Moreover, a negative induced voltage is output at the timings when the triangular wave current switches from negative to positive. Accordingly, by measuring with a counter the timings at which these positive-negative pulse-shaped induced voltages are generated, it is possible to obtain responses to the external magnetic field.

Figure 7A:
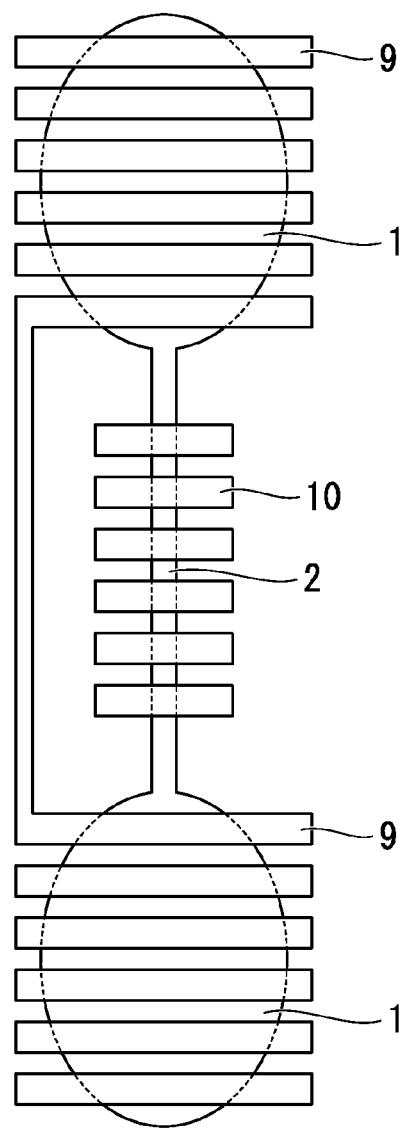
FIG. 7A is a view illustrating an example of the shape of the magnetic core of the fluxgate sensor according to the first preferred embodiment of the present invention.
Figure 7B:
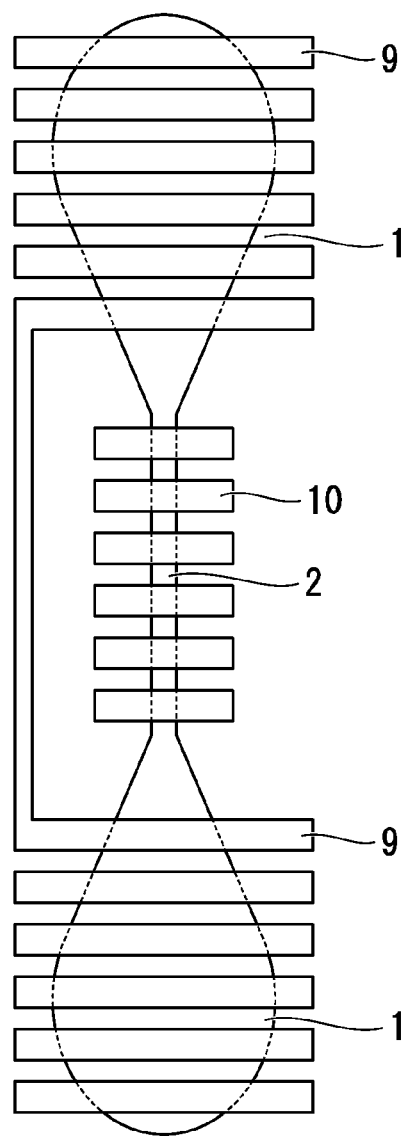
FIG. 7B is a view illustrating an example of the shape of the magnetic core of the fluxgate sensor according to the first preferred embodiment of the present invention.
Figure 7C:
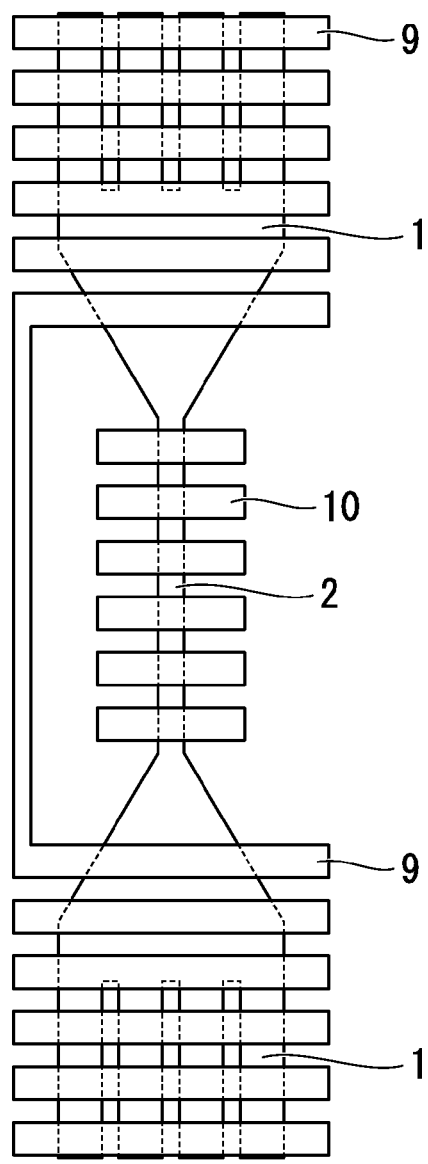
FIG. 7C is a view illustrating an example of the shape of the magnetic core of the fluxgate sensor according to the first preferred embodiment of the present invention.

Note that in the above described first preferred embodiment, the magnetic core shown in FIG. 4 is used as an example of a magnetic core, however, as far as the purpose of the present invention is concerned, the shape of the magnetic core is not limited to this shape and any shape may be employed provided that the width of the end portions thereof is wider than the width in the center portion thereof. FIGS. 7A through 7C illustrate examples of shapes of the magnetic core of the fluxgate sensor according to the first preferred embodiment of the present invention. Note that in FIGS. 7A through 7C which are typical views, the magnetic core and the top-side wiring of the first solenoid coil 9 and the second solenoid coil 10 are shown, while, in actual fact, when viewed from above the drawing, portions of the magnetic core that overlap the coils are hidden by the coils.

In addition to the above described structure, it is also possible for a sealing layer to be formed covering the second wiring layer 7 as part of the structure of the fluxgate sensor.

Next, a method of manufacturing the fluxgate sensor according to the first preferred embodiment of the present invention will be described.

Firstly, a film of a barrier metal such as Ti, Cr, TiW or the like is formed on top of the non-magnetic substrate 100 by sputtering, and a film of Cu is then formed on top of this by sputtering. Next, a resist pattern which will become the first wiring layer 4 is formed by means of photolithography, and the wiring pattern is then formed by wet etching. Alternatively, it is also possible to form the first wiring layer 4 by means of electroplating using the aforementioned sputtered films as seed films. At this time, in order to form the magnetic core 3 of top of the insulating layer which is formed after this, it is desirable for the thickness of the first wiring layer 4 to be such that bumps and indentations in the surface of the insulating layer created by this wiring are sufficiently small compared to the thickness of the magnetic core, and such that the resistance of the coil is low. Specifically, it is preferable for the thickness of the first wiring layer 4 to be between 0.2 μm and 2 μm.

Next, the first insulating layer 5 is formed by coating a photosensitive resin thereon and then performing exposure, developing, and thermosetting processing. At this time, portions where the first wiring layer 4 and the second wiring layer 7 which is formed subsequently are connected together are left open, and the first wiring layer 4 and the magnetic core 3 which is formed subsequently are insulated from each other. At this time, it is desirable for the thickness of the first insulating layer 5 to only be sufficiently thick to soften any bumps and indentations in the first wiring layer 4. Specifically, it is desirable for the thickness of the first insulating layer 5 to be approximately 3 to 10 times the thickness of the first wiring layer 4. Note that, in FIG. 5, in order for the first wiring layer 4 to be displayed at a suitable size in the drawing, the respective layers are not shown in these proportions.

Moreover, at this time, photosensitive polyimide is required in order to protect against any distortion being generated in the magnetic core 3 which is due to contraction and deformation caused by heat history in the subsequent steps. Consequently, it is desirable for the photosensitive polyimide to be a resin which has a sufficient heat resistance so that thermal contraction and deformation which are caused, for example, by solder reflow during packaging and by the thermal processing in the magnetic field which is performed in order to impart induced magnetic anisotropy to the magnetic core do not occur. Specifically, it is desirable for the glass transition temperature (Tg) of the photosensitive polyimide to be not less than 300° C. Namely, it is desirable for the resin which is used here to be a polyimide or polybenzoxazole having high heat resistance, or a thermally cured novolac-based resin.

Next, the soft magnetic body film which forms the magnetic core 3 is formed by sputtering, and patterning is then performed thereon via photolithography and etching such that the desired shape is achieved. For the soft magnetic body film, zero magnetostriction Co-based amorphous films which are typified by CoNbZr and CoTaZr and the like, as well as NiFe alloys, and CoFe alloys and the like are desirably used. Because these soft magnetic body films are difficult materials to etch, it is also possible to perform the sputtering film formation after firstly forming a resist layer, and then using a photolithographic method to remove the resist so as to obtain the desired pattern. Moreover, after the magnetic film which will form the magnetic core 3 has been formed, it is desirable to perform heat processing in a rotating magnetic field or heat processing in a static magnetic field in order to remove stress and non-uniform uniaxial anisotropy which is imparted thereto during film formation, and to impart uniform induced magnetic anisotropy.

Moreover, it is also possible to form the magnetic core 3 by molding a NiFe alloy or a CoFe alloy into a desired shape using an electroplating method which employs a resist frame.

Next, the second insulating layer 6 is formed by performing exposure, developing, and thermosetting processing on the photosensitive resin such that the connecting portions between the first wiring layer 4 and the second wiring layer 7 are left open, and such that the magnetic core 3 and the second wiring layer 7 are electrically insulated from each other.

Next, a seed film is formed by firstly forming a film of a barrier metal such as Ti, Cr, TiW or the like by means of sputtering on the substrate including the second insulating layer 6 and the aperture portions in the second insulating layer 6, and by then forming a film of Cu thereon by means of sputtering. Next, a resist frame is formed and a desired wiring pattern is formed by Cu electroplating. This seed layer is then etched so as to form the second wiring layer 7.

Finally, by forming electrode pads and terminals which are used to make external connections, as well as a protective film where these are necessary, the fluxgate sensor according to the first preferred embodiment of the present invention is created. Here, it is possible to apply methods which are used for typical semiconductor devices and thin-film devices such as sold bumps, metal bumps, and wire bonding and the like to the forming of the externally connected terminals.

Note that, in the above description, sputtered and electroplated Cu is used for the first wiring layer 4 and the second wiring layer 7, however, these may also be formed using electroless Cu or electrolytic Au plating, and it is also possible to use a superconductive film which is formed by a sputtered film of Cu, Al, or Au or the like. In addition, a resin material is used for the first insulating layer 5 and the second insulating layer 6, however, it is also possible to form an insulating film of SiO2, SiN, Al2O3 or the like by sputtering or chemical vapor deposition (CVD), and to form the above described aperture portions by means of dry etching.

Figure 8:
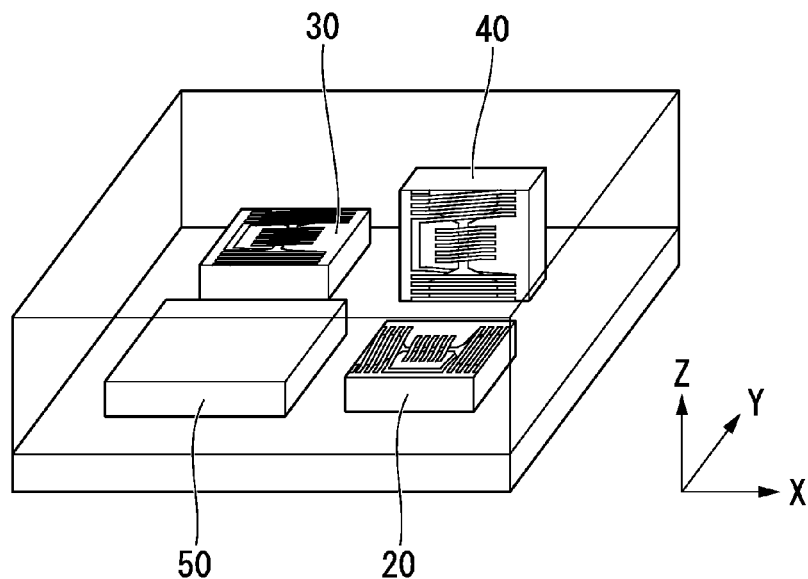
FIG. 8 is a schematic perspective view of an electronic compass according to a first preferred embodiment of the present invention.

Next, an electronic compass of the first preferred embodiment of the present invention will be described. FIG. 8 is a schematic perspective view showing an electronic compass according to the first preferred embodiment of the present invention.

The electronic compass shown in FIG. 8 is formed by mounting a first fluxgate (X-axis) sensor 20, a second fluxgate (Y-axis) sensor 30, a third fluxgate (Z-axis) sensor 40, and an IC 50 for signal processing on a single substrate. Specifically, the first fluxgate sensor 20 and the second fluxgate sensor 30 are positioned such that their formed surfaces are substantially parallel to the surface of the substrate used to form the electronic compass, and such that their directions of magnetic sensitivity are orthogonal to each other. The fourth fluxgate sensor 40 is positioned so as to be substantially perpendicular to the surface of the substrate used to form the electronic compass. At this time, in the first fluxgate sensor 20, the second fluxgate sensor 30, and the third fluxgate sensor 40, it is desirable for the shapes of all areas excluding the external connection terminals, namely, for the shapes of the portions where the magnetic core 3 and the coils 61 and 71 are formed to be the same. The reason for this is that, by making the characteristics of each of the first fluxgate sensor 20, the second fluxgate sensor 30, and the third fluxgate sensor 40 all uniform, there is no need to correct any variations in the characteristics of each sensor, and it becomes possible to simplify the electronic circuitry. Moreover, because the third fluxgate sensor 40 is mounted substantially perpendicular relative to the substrate surface, it is desirable for the length of the direction of magnetic sensitivity thereof to be 1 mm or less, and more preferably to be approximately 0.5 mm in order to reduce the thickness of the electronic compass.

The signal processing IC 50 is provided with a circuit that supplies triangular wave current of a fixed frequency to the excitation coil 61 in each fluxgate sensor, a detection circuit that is used to detect the induced voltage appearing in the detection coil 71, a counter that is used to count the timings at which the induced voltage is generated, and a selector that is used to switch the connections with the aforementioned two circuits between the first fluxgate sensor 20, the second fluxgate sensor 30, and the third fluxgate sensor 40. By employing this structure, it is possible to sequentially measure the respective magnetic fields in three axial directions by means of the first fluxgate sensor 20, the second fluxgate sensor 30, and the third fluxgate sensor 40, and, by making calculations, to obtain an electronic compass having minimal bearing errors.

EXAMPLES

A fluxgate sensor was manufactured in the above described manner for use as an example. The shape of the magnetic core of the fluxgate sensor was as follows: the length A in the longitudinal direction of the magnetic core=480 μm, the width B of the end portions 1=80 μm, the width C of the center portion 2=20 μm, the length D in the longitudinal direction of the end portions 1=140 μm, the number of winds in the excitation coils was 16.5, and the number of winds in the pickup coil was 6.5.

Figure 9:
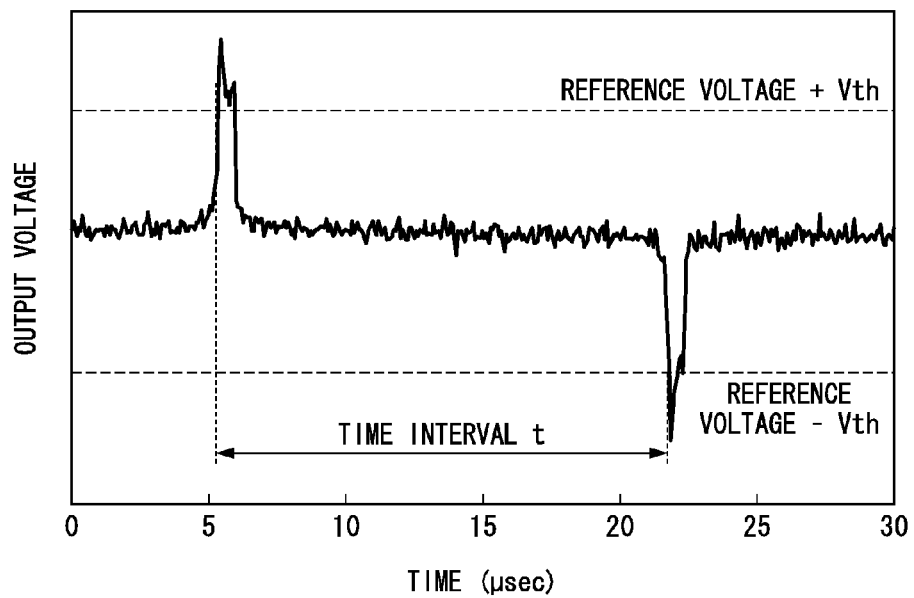
FIG. 9 is a graph showing a pickup voltage waveform of the fluxgate sensor according to the first preferred embodiment of the present invention.
Figure 10:
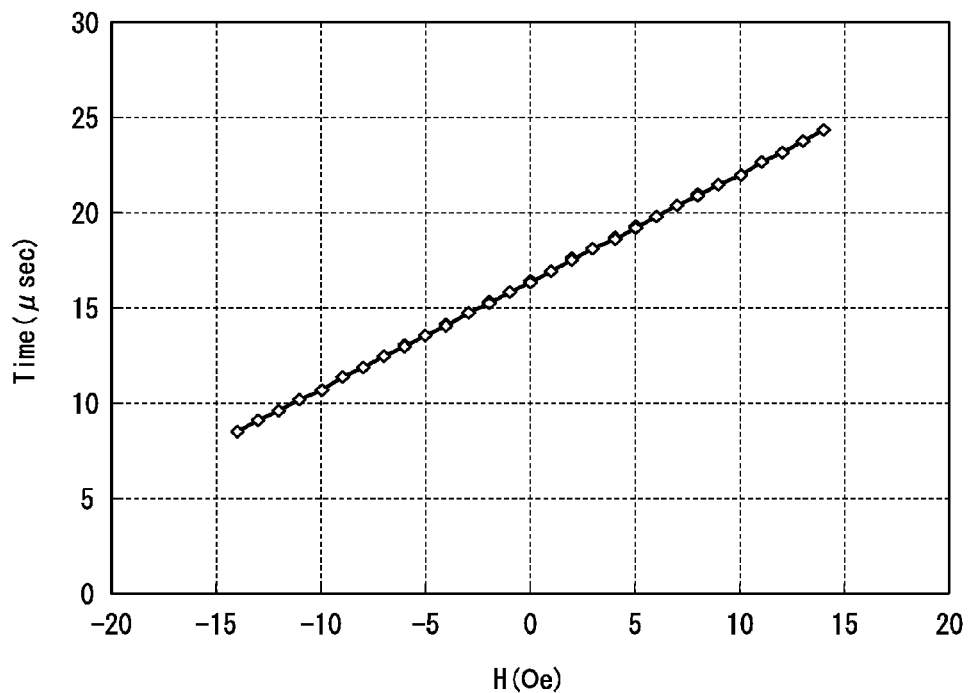
FIG. 10 is a graph showing the external magnetic field dependence of the output of the fluxgate sensor according to the first preferred embodiment of the present invention.

FIG. 9 is a graph showing the output waveform of a positive/negative pulse-shaped pickup voltage when a triangular wave current having an amplitude of 100 mA, and a frequency of 30 kHz was supplied to the fluxgate sensor of the aforementioned example. FIG. 10 is a graph showing the output from a fluxgate sensor relative to the external magnetic field dependency, namely, the external magnetic field in a time interval t during which the positive/negative pulse-shaped pickup voltage shown in FIG. 9 exceeded the respective reference voltages Vth.

It is possible to improve the number of winds on the excitation coils by winding solenoid coils around the wide end portions 1 of the magnetic core of the fluxgate sensor. By doing this, even if the size of the sensor is miniaturized to 0.5 mm or less, a pickup waveform having a superior SN ratio can be obtained. The output of the fluxgate sensor of the above described example exhibited excellent linearity even relative to an external magnetic field, and any shift from an ideal straight line was 0.5% within a range of ±14 Oe. The excitation efficiency a of the above described fluxgate sensor was 0.29 Oe/mA.

Figure 15:
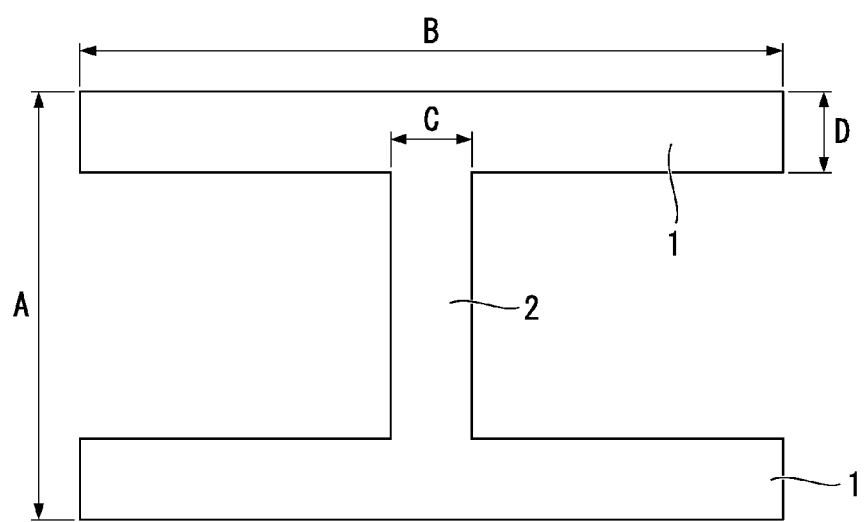
FIG. 15 is a schematic view showing the shape of a magnetic core in a conventional fluxgate sensor.

As a comparative example, a fluxgate sensor shown in FIG. 15 having the same sensor length as the fluxgate sensor of the above described example, and in which the coils were wound at the same wiring pitches was manufactured. The fluxgate sensor of this comparative example had a core in which the length A in the longitudinal direction of the magnetic core=480 μm, the width B of the end portions 1=600 μm, the width C of the center portion 2=30 μm, and the length D in the longitudinal direction of the end portions 1=60 μm. In the fluxgate sensor of this comparative example, the excitation efficiency was 0.20 Oe/mA. Accordingly, it is clear that the fluxgate sensor according to the example of the present invention has a high level of excitation efficiency.

The fluxgate sensor of the first preferred embodiment of the present invention has a structure in which solenoid coils are wound as far as the ends of the end portions 1, and because there are a large number of winds in the solenoid coils, and because the width of the end portions 1 is greater than the width of the center portion 2, magnetic flux generated in the end portions 1 becomes concentrated in the center portion 2. Accordingly, the magnetic flux density of the center portion 2 is greater than the magnetic flux density of the end portions 1, and the apparent value of the magnetic field Hexc created by the excitation coils in the center portion 2 increases. As a result of this, the fluxgate sensor according to the first preferred embodiment of the present invention has a high level of excitation efficiency.

Figure 11:
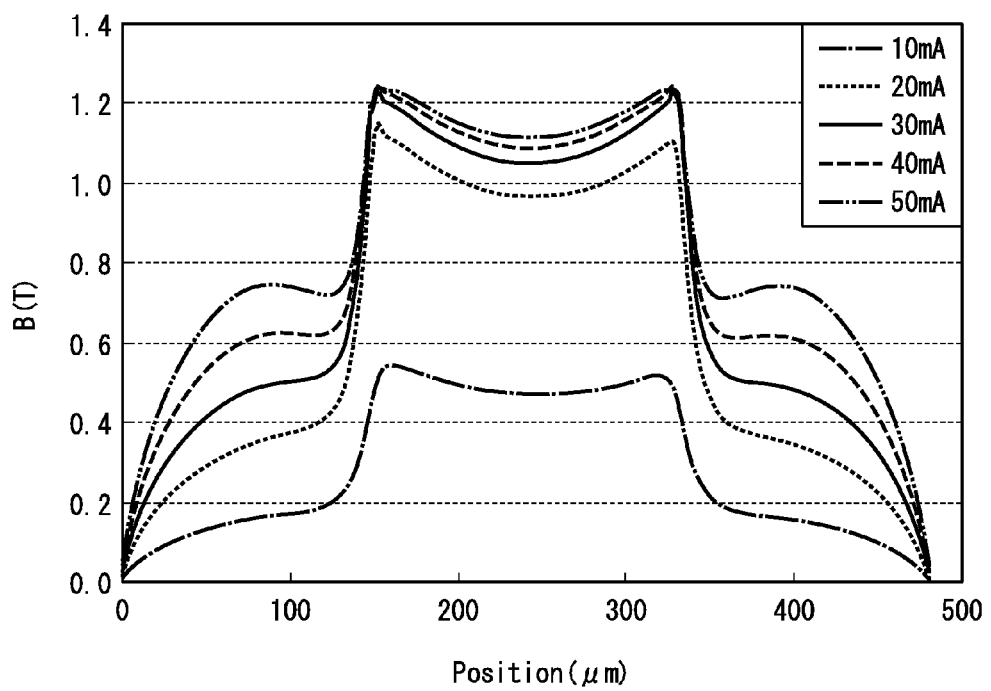
FIG. 11 is a graph showing the results when the magnetic flux density inside the core in the fluxgate sensor according to the first preferred embodiment of the present invention was calculated.

FIG. 11 is a graph showing the results when the magnetic flux density at a cross-section a-a' of the core interior when excitation current was supplied to the fluxgate sensor according to the first preferred embodiment of the present invention shown in FIG. 4 were calculated using a three-dimensional finite element method. Because a structure in which the width B of the end portions 1 is larger than the width C of the center portion 2 is employed in the magnetic core of the fluxgate sensor, it can be seen from FIG. 11 that the magnetic flux density of the center portion 2 is higher than the magnetic flux density of the end portions 1, and that the magnetic flux density of the center portion 2 becomes saturated by a smaller current value. This fact shows that, in the fluxgate sensor according to the first preferred embodiment of the present invention, the apparent magnetic field Hexc created by the excitation coil increases, and the excitation efficiency increases.

As has been described above, in the first preferred embodiment of the present invention, in a fluxgate sensor that is formed by a thin film, it is possible to reduce the diamagnetic field of a detection portion by using an H-type magnetic core to compensate for any reduction in sensitivity which is caused by the diamagnetic field when the fluxgate sensor is reduced in size. By doing this, even though the size has been reduced, the excitation efficiency is increased, and it is possible to construct a highly sensitive fluxgate sensor. It is also possible to construct a fluxgate sensor that has high sensitivity at a lower current and has a wide measurement magnetic field range.

As has been described above, in the first preferred embodiment of the present invention, excitation coils are wound onto the broad-width end portions 1 at the two ends of an H-type magnetic core. The magnetic flux generated in this magnetic core by the excitation coils is expressed by the cross-sectional area of the broad-width end portions 1 at both ends of the magnetic corexthe magnetic flux density. When alternating current is supplied to the excitation coils, the magnetic flux generated in the magnetic core by the excitation coils is guided to the narrow-width center portion 2 of the magnetic core which is continuous with the end portions of the magnetic core. At this time, using the width B of the end portions 1 of the magnetic core and the width C of the center portion 2 thereof, the cross-sectional area of the center portion 1 is C/B times the cross-sectional area of the broad-width end portions 1 at the two ends. In the process whereby the magnetic flux is guided from the end portions 1 at the two ends of the magnetic core to the center portion 2 thereof, then unless there is any magnetic flux loss, the magnetic flux is the same in the end portions 1 and the center portion 2. Consequently, the magnetic flux density of the center portion 2 is B/C times the magnetic flux density of the end portions 1. Accordingly, the greater the ratio between the widths of the end portions 1 of the magnetic core and the center portion 2 thereof, the more the magnetic flux density improves markedly.

As has been described above, in the first preferred embodiment of the present invention, the excitation coils and the detection coil are wound independently of each other. As a result, it is possible to set optional values for the number of winds on the excitation coils and the detection coil, the wire width, and the space between the wires. Consequently, the excitation coils and the detection coil can be freely designed to match the specifications sought in the sensor.

As has been described above, in the first preferred embodiment of the present invention, solenoid coils are wound over the entire area of the magnetic core. Accordingly, compared with the structures described in Japanese Unexamined Patent Application, First Publication No. 2007-279029 and PCT International Publication No. WO 2007-126164 Pamphlet, it is possible for the number of winds in the solenoid coils to be increased, and for the magnetic flux generated in the magnetic core to be increased. Consequently, the magnetic flux density in the center portion 2 is raised, and the detection sensitivity of the magnetic sensor is improved.

When the width of the portions connecting together the end portions 1 at both ends of the magnetic core with the center portion 2 thereof becomes abruptly narrower at an angle which is close to a right angle, as is shown in FIG. 1A, because localized magnetic flux saturation tends to occur in these angle portions, there is a possibility of magnetic flux loss occurring. In contrast, as is shown in FIG. 1B, if a tapered shape is provided at the boundary portions between the end portions 1 of the magnetic core and the center portion 2 thereof, then it is possible to suppress localized magnetic flux saturation, and the magnetic flux density in the center portion 2 of the magnetic core can be improved.

Figure 13:
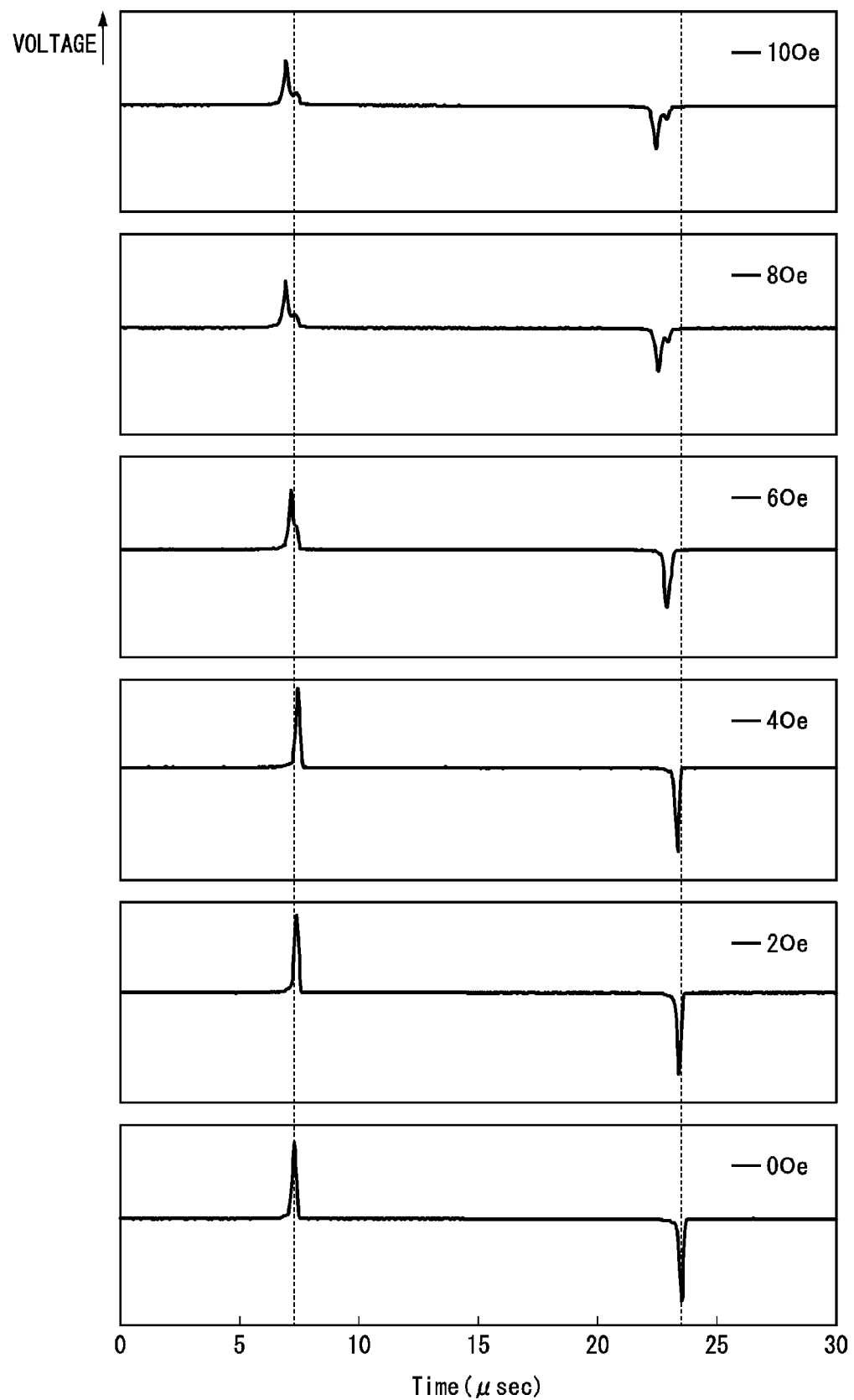
FIG. 13 contains graphs showing pickup voltage waveforms relative to a magnetic field that is orthogonal to the direction of magnetic sensitivity in the fluxgate sensor of a comparative example.

The cross-axis sensitivity will now be described. FIG. 13 contains graphs showing pickup voltage waveforms relative to a magnetic field that is orthogonal to the direction of magnetic sensitivity when magnetic fields of 0 Oe through 10 Oe are applied in orthogonal directions within the film plane in the fluxgate sensor of the above described comparative example. From FIG. 13 it can be understood that by applying a magnetic field which is orthogonal to the direction of magnetic sensitivity, the timings at which a pickup voltage is generated as well as the peak height of the pickup voltage both change, and cross-axis sensitivity is generated. It can also be seen that the changes caused by an external magnetic field of approximately 4 Oe through 6 Oe are particularly conspicuous. Even when these characteristics were obtained for a magnetic field which is orthogonal to the direction of magnetic sensitivity of the sensor, then if only geomagnetism of approximately 0.3 Oe is being detected, the effect on the azimuth accuracy is small. However, if the sensor is actually mounted on an electronic instrument and used, the magnetic field generated from the components mounted inside the instrument becomes added to this. Consequently, in some cases the magnetic field generated from the components mounted inside the instrument creates offset from the geomagnetism, and it is no longer possible to obtain accurate measurements. Accordingly, it becomes necessary to measure and calculate the offset magnetic field generated from peripherally mounted components, and then perform calibration in order to measure the geomagnetism. However, as is described above, if the sensor has the characteristic that its output varies relative to a magnetic field in an orthogonal direction relative to the direction of magnetic sensitivity of the sensor, then if the offset magnetic field is overlapped in an orthogonal direction relative to the sensor, not only does the size of the error in the value itself which was calculated for the offset magnetic field increase, but because the output is changed by the overlapping of the offset magnetic field, there is a deterioration in the geomagnetism detection accuracy.

Figure 14:
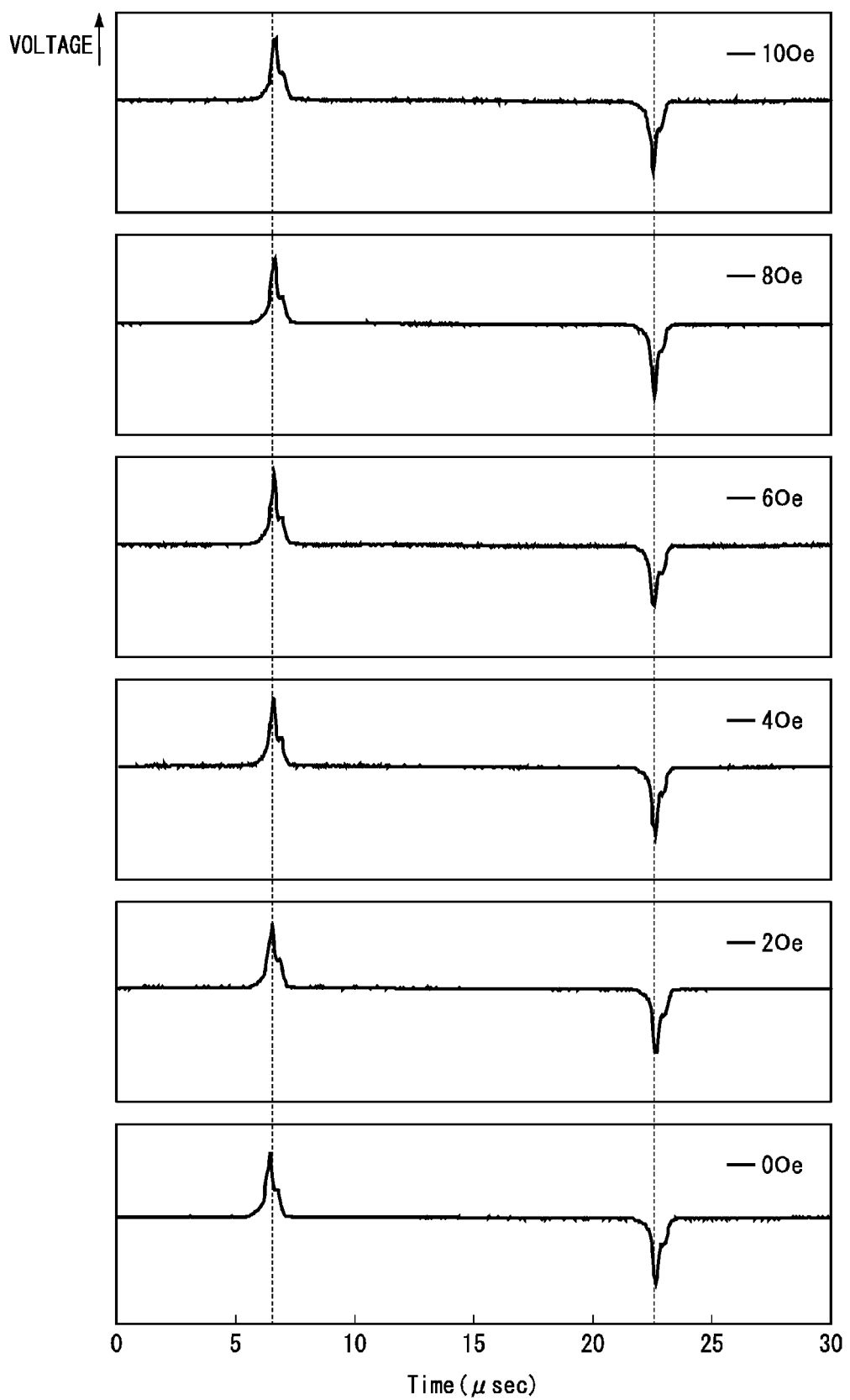
FIG. 14 contains graphs showing pickup voltage waveforms relative to a magnetic field that is orthogonal to the direction of magnetic sensitivity in the fluxgate sensor of an example of the present invention.

In contrast, FIG. 14 contains graphs showing pickup voltage waveforms relative to a magnetic field that is orthogonal to the direction of magnetic sensitivity when magnetic fields of 0 Oe through 10 Oe are applied in orthogonal directions within the film plane in the fluxgate sensor of the above described example of the present invention in the same way as is described above. It can be seen that by applying a magnetic field which is orthogonal to the direction of magnetic sensitivity, the timings at which a pickup voltage is generated as well as the peak height of the pickup voltage exhibit substantially no change, and cross-axis sensitivity is extremely small. The reason for this is that, in addition to the broad-width end portions at both ends of the core being designed such that the shape anisotropy caused by the diamagnetic field coincides with the longitudinal direction of the core, namely, with the direction of magnetic sensitivity of the sensor, but also because the end portions are in an extremely excited state in the direction of magnetic sensitivity, they are largely unaffected by any magnetic field from an orthogonal direction.

In the case of a fluxgate sensor, it is possible to broaden the measurement magnetic field range of the sensor by using an excitation current and, as is shown in FIG. 10, it is possible to secure a broad measurement magnetic field range of 10 Oe or more while maintaining excellent linearity. By providing a broad measurement magnetic field range in this manner, it becomes possible to obtain a wide calibration range for the offset magnetic field.

At this time, by reducing the effects on magnetic fields which are orthogonal to the direction of magnetic sensitivity of the sensor, it becomes possible to increase the calibration accuracy of an offset magnetic field in a wide range magnetic field, and to improve the degree of freedom in the placement of components within an instrument.

Second Preferred Embodiment

Figure 12:
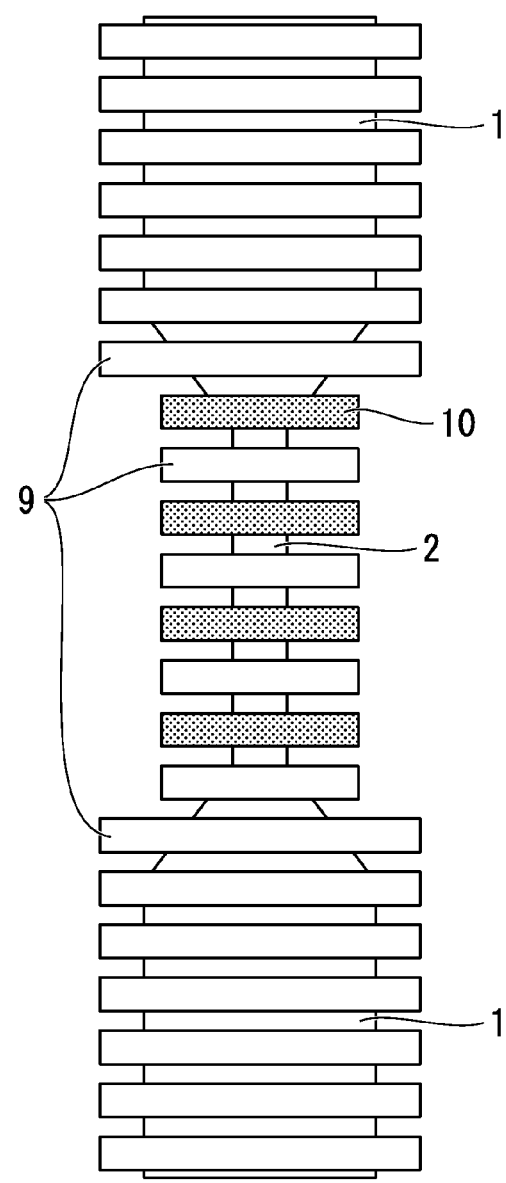
FIG. 12 is a view illustrating how excitation coils and a detection coil are wound in a fluxgate sensor according to a second preferred embodiment of the present invention.

FIG. 12 illustrates how excitation coils and a detection coil are wound in a fluxgate sensor according to a second preferred embodiment of the present invention.

In the first preferred embodiment, the excitation coils are only wound onto the broad-width end portions 1 at the two ends of the magnetic core. In contrast to this, in the second preferred embodiment, the first solenoid coils 9, which are excitation coils, are wound not only onto the broad-width end portions 1 at the two ends, but also onto the narrow-width center portion 2. Namely, the excitation coils are wound over the entire circumference of the magnetic core, and the second solenoid coil 10, which is a detection coil, is only wound onto the center portion 2 of the magnetic core. In this winding mode as well, the same operating effects as in the above described first preferred embodiment are obtained.

Third Preferred Embodiment

A third preferred embodiment of the present invention will now be described.

The magnetic core of a fluxgate sensor according to a third preferred embodiment of the present invention has the same structure as that of the fluxgate sensor according to the first preferred embodiment of the present invention, however, it differs in the operation of the solenoid coil. Namely, in the same way as in the first preferred embodiment of the present invention, the magnetic core of the fluxgate sensor according to the third preferred embodiment of the present invention has an H-shape such as that shown in FIGS. 1A and 1B. The magnetic core of the fluxgate sensor according to the third preferred embodiment of the present invention has end portions 1 and a center portion 2. The width B of the end portions 1 is wider than that of the width C of the center portion 2. Unlike the first preferred embodiment of the present invention, however, in the third preferred embodiment of the present invention, the first solenoid coils which are wound around the circumference of the end portions 1 are pickup coils. The second solenoid coil which is wound around the circumference of the center portion 2 is an excitation coil.

In the same way as the first preferred embodiment of the present invention, a top view of the fluxgate sensor according to the third preferred embodiment of the present invention is the same as the view shown in FIG. 4. However, unlike the first preferred embodiment of the present invention, in the third preferred embodiment of the present invention, the first solenoid coils 9 are pickup coils, and the second solenoid coil 10 is an excitation coil. The narrow-width center portion 2 of the excitation coil 3 is excited when power is supplied to the second solenoid coil 10 which is wound around the circumference thereof. In contrast, induced voltage is applied to the broad-width end portions 1 of the magnetic core 3, and this induced voltage is detected by the first solenoid coils 9 that are wound around the circumference of the end portions 1.

The method of manufacturing the fluxgate sensor according to the third preferred embodiment of the present invention is the same as that used in the first preferred embodiment of the present invention. In the fluxgate sensor according to the third preferred embodiment of the present invention as well, the same operating effects as in the above described first preferred embodiment are obtained.

The fluxgate sensor of the present invention can be used as a small sized magnetic sensor. Moreover, this magnetic sensor can be widely used as an electronic compass in mobile telephones, portable navigation devices, game controllers, and the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A fluxgate sensor comprising:
a first wiring layer that is formed on a substrate;
a first insulating layer that is formed so as to cover the first wiring layer;
a magnetic core that is formed on the first insulating layer, and that includes a center portion, and first and second end portions that are continuous with the center portion and have a broader width than the width of the center portion, and are positioned at the two ends of the center portion;
a second insulating layer that covers the magnetic core, and is formed on the first insulating layer; and
a second wiring layer that is formed on the second insulating layer, wherein
the first wiring layer and the second wiring layer have a plurality of wires that are substantially parallel to each other, and
the two ends of the wires of the first wiring layer and of the wires of the second wiring layer are electrically connected together via portions where the first insulating layer and the second insulating layer have been selectively removed, and
spiral-shaped first solenoid coils are wound around the first and second end portions, and
a spiral-shaped second solenoid coil is wound around the center portion.

2. The fluxgate sensor according to claim 1, wherein a value of a ratio B/D between a width B of the first and second end portions and a length D of the longitudinal direction of the first and second end portions is less than 1.

3. The fluxgate sensor according to claim 1, wherein the first solenoid coil contains a third solenoid that is wound around the first end portion and a fourth solenoid coil that is wound around the second end portion, and the third solenoid coil and the fourth solenoid coil are connected together in series, and have substantially the same number of winds.

4. The fluxgate sensor according to claim 1, wherein the first solenoid coil is wound around the center portion and the first and second end portions.

5. An electronic compass comprising:
a substrate; and
first, second, and third fluxgate sensors that are located on the substrate, and that are aligned respectively with three axes, wherein
each of the first, second, and third fluxgate sensors includes:
a first wiring layer that is formed on a substrate;
a first insulating layer that is formed so as to cover the first wiring layer;
a magnetic core that is formed on the first insulating layer, and that includes a center portion, and first and second end portions that are continuous with the center portion and have a broader width than the width of the center portion, and are positioned at the two ends of the center portion;

a second insulating layer that covers the magnetic core, and is formed on the first insulating layer; and a second wiring layer that is formed on the second insulating layer, and wherein the first wiring layer and the second wiring layer have a plurality of wires that are substantially parallel to each other, and the two ends of the wires of the first wiring layer and of the wires of the second wiring layer are electrically connected together via portions where the first insulating layer and the second insulating layer have been selectively removed, and spiral-shaped first solenoid coils are wound around the first and second end portions, and a spiral-shaped second solenoid coil is wound around the center portion.

6. The electronic compass according to claim 5, wherein a value of a ratio B/D between a width B of the first and second end portions and a length D of the longitudinal direction of the first and second end portions is less than 1.

7. The electronic compass according to claim 5, wherein the first solenoid coil contains a third solenoid that is wound around the first end portion and a fourth solenoid coil that is wound around the second end portion, and the third solenoid coil and the fourth solenoid coil are connected together in series, and have substantially the same number of winds.

8. The electronic compass according to claim 5, wherein the first solenoid coil is wound around the center portion and the first and second end portions.

9. A fluxgate sensor comprising at least:
a first wiring layer;
a first insulating layer that is formed so as to cover the first wiring layer;
a magnetic core that is formed on the first insulating layer, and that is provided with a detection portion, and first and second excitation portions that are continuous with the detection portion and have a broader width than the width of the detection portion, and are positioned at the two ends of the detection portion;
a second insulating layer that covers the magnetic core, and is formed on the first insulating layer; and
a second wiring layer that is formed on the second insulating layer, wherein
the first wiring layer and the second wiring layer have a plurality of wires that are substantially parallel to each other, and
the two ends of the wires of the first wiring layer and of the wires of the second wiring layer are electrically connected together via portions where the first insulating layer and the second insulating layer have been selectively removed, and
spiral-shaped excitation coils are wound around the first and second excitation portions.

10. The fluxgate sensor according to claim 9, wherein the excitation coils contain a first excitation coil that is wound around the first excitation portion, and a second excitation coil that is wound around the second excitation portion, and the first excitation coil and the second excitation coil are connected together in series such that the magnetic fields they generate are aligned in the same direction.

11. The fluxgate sensor according to claim 9, wherein the excitation coils are wound around the excitation portions and the detection portion that is formed in the center portion of the magnetic core.

12. An electronic compass in which three of the fluxgate sensors according to claim 9 are located on a single substrate, so as to be aligned respectively with three axes.

* * * * *